United States Patent
Garbuzov et al.

(10) Patent No.: US 7,084,444 B2
(45) Date of Patent: Aug. 1, 2006

(54) METHOD AND APPARATUS FOR IMPROVING EFFICIENCY IN OPTO-ELECTRONIC RADIATION SOURCE DEVICES

(75) Inventors: Dmitri Zalmanovich Garbuzov, Princeton, NJ (US); Raymond J. Menna, Newtown, PA (US)

(73) Assignee: Trumpf Photonics, Inc., Cranbury, NJ (US)

( * ) Notice: Subject to any disclaimer, the term of this patent is extended or adjusted under 35 U.S.C. 154(b) by 0 days.

(21) Appl. No.: 10/471,794

(22) PCT Filed: Mar. 19, 2001

(86) PCT No.: PCT/US01/08941

§ 371 (c)(1),
(2), (4) Date: Mar. 11, 2004

(87) PCT Pub. No.: WO02/075878

PCT Pub. Date: Sep. 26, 2002

(65) Prior Publication Data

US 2004/0131098 A1 Jul. 8, 2004

(51) Int. Cl.
*H01L 29/861* (2006.01)
(52) U.S. Cl. .................. 257/292; 257/184; 257/290; 372/45
(58) Field of Classification Search .............. 257/292
See application file for complete search history.

(56) References Cited

U.S. PATENT DOCUMENTS 5,818,860 A * 10/1998 Garbuzov et al. ............ 372/45
5,987,047 A    11/1999 Valster et al.

FOREIGN PATENT DOCUMENTS

| EP | 0 540 799 | 5/1993 |
|---|---|---|
| EP | 0 575 684 | 12/1993 |
| EP | 0 690 536 | 1/1996 |
| EP | 0 851 547 | 7/1998 |
| EP | 0 959 540 | 11/1999 |
| JP | 09045989 | 2/1997 |

OTHER PUBLICATIONS

Supplemental Search Report from EP 01930425.2, mailed Oct. 26, 2005.
Garbuzoy et al., "Broadened Waveguide, Low Loss 1.5 µm InGaAsP/InP and 2 µm InGaAsSb/AlGaAsSb Laser Diodes" 1997 Int. Conference on Indium Phosphide and Related Materials, Hyannis, Cape Cod, May 11-15, 1997, Indium Phosphide and Related Materials, New York, NY: IEEE, US, May 11, 1997, pp. 551-554.

* cited by examiner

*Primary Examiner*—Fetsum Abraham
(74) *Attorney, Agent, or Firm*—Fish & Richardson P.C.

(57) ABSTRACT

A method for improving the efficiency for an optoelectronic device, such as semiconductor lasers, Superluminescence Light Emitting Diodes (SLDs), Gain Chips, optical amplifiers is disclosed, see FIG. 4B. In accordance with the principles of the invention, at least one blocking layer (70) is interposed at the interface between materials composing the device. The at least one blocking layers creates a barrier that prevents the leakage of electrons from a device active region contained in the waveguide region, to a device clad region (66). In one aspect of the invention, a blocking layer (70) is formed at the junction of the semiconductor materials having different types of conductivity. The blocking layer prevents electrons from entering the material of a different polarity. In another aspect of the invention, a low-doped or undoped region (64) is positioned adjacent to the blocking layer (70) to decrease optical losses.

23 Claims, 5 Drawing Sheets

US 7,084,444 B2

METHOD AND APPARATUS FOR IMPROVING EFFICIENCY IN OPTO-ELECTRONIC RADIATION SOURCE DEVICES

FIELD OF THE INVENTION

This invention relates to semiconductor opto-electronic technology, and more particularly, high power opto-electronic devices, such as high power semiconductor lasers, amplifiers, gain chips and superluminescence Light Emitting Diodes (SLEDs) having improved efficiency and low beam divergence for telecom applications.

BACKGROUND OF THE INVENTION

Opto-electronic devices, such as semiconductor lasers and SLEDs provide the light source for different aspects of fiber-optic telecommunication systems. Opto-electronic radiation source devices, such as lasers, having wavelength outputs ranging from 1.31 to 1.55 microns (µm) are the most commonly used lasers for telecommunication operation. Radiation source devices with wavelengths of 1.31 µm are typically used for short distance transmission and cable TV signals, while wavelengths of 1.42–1.6 µm are typically used for fiber optic communications. Lasers having wavelengths in the range of 1.42 to 1.48 µm are typically used as pump lasers for Raman and Erbium Doped Fiber Amplifiers (EDFA). In long distance transmission one desires to use, for example, lasers having wavelengths between 1.54 to 1.56 µm. For all telecom applications and especially for EDFA pump sources, operating currents for semiconductor sources exceed by more than an order of magnitude the threshold current.

Essentially, as one can ascertain from the prior art, a weak temperature dependence of the main laser characteristics is extremely important for telecom lasers. As one knows in the prior art, it is not easy to keep high performance at elevated temperatures for lasers operating in the wavelength range of 1.3–1.5 µm. A widely used material for telecom lasers is InGaAsP compounds grown on InP substrates. Numerous investigations of InGaAsP/InP lasers have demonstrated that the strong temperature degradation of their parameters is partially associated with insufficient high energy level barriers for confinement of the electrons in the laser active region. As a result of the low barrier in the conduction band, some of the electrons injected from n-doped cladding layer passes through the active region and are lost in the p-doped cladding layer. There are many investigators that have looked at this problem, and people have provided various solutions to decrease electron leakage at elevated temperatures. For example, see an article entitled, "Lasing Characteristics Under High Temperature Operation of 1.55 µm Strained InGaAsP/InGaAlAs MQW Laser With InAlAs Electron Stopper Layer" by H. Murai et al., published in Electronics Letters on Nov. 23, 1995, Volume 31, Number 24. In that paper there is shown a 1.55 µm strained InGaAsP/InGaAlAs MQW laser in which InGaAlAs cladding layers and InAlAs electron stopper layer have been incorporated to reduce electron leakage current. The device showed low threshold current with high maximum temperature of CW operation. As indicated in the paper, superior lasing characteristics were demonstrated through comparison with conventional strained MQW lasers without electron stop layer. A similar design was used for the fabrication of 1.3 µm lasers that could operate without thermoelectric coolers. Such lasers are required for subscriber networks and optical interconnection systems. See, for example, an article entitled, "High Temperature Operation of AlGaInAs Ridge Waveguide Lasers With a p-AlInAs Electron Stopper Layer" published in Japanese Journal of Applied Physics on pages 1230 through 1233 by Takemasa et al.

As can be seen in these papers, there are band diagrams that show the active region of the laser including Quantum Wells (QW) sandwiched between layers of materials with a band gap larger than that of the active region. Thus energy barriers confining the injected electrons and holes in the active region are created. The prior art utilized InGaAsP and InP to create an active region and barriers for lasers operating in the 1.2 to 2.0 µm range. The disadvantage of these material is that the energy barriers for electrons is lower than that for holes and when one wants to inject electrons to generate photons in the QWs, there is a leakage of electron current from active region to the p-doped InP cladding layer that limits laser performance. This leakage current component is superlinearly related to total current and temperature sensitive, in that as the leakage current increases at a rate greater than an increase in the total current. The problem is more severe for lasers operating at 1.3 µm than for lasers that operate at 1.55 µm. In fact, the problem is so severe that one employs AlInGaAs as a cladding layer material or AlInAs as a stop-electron (blocking) layers.

However, aluminum compounds are not desirable for telecommunication devices because aluminum easily oxidizes and thus creates problems for laser fabrication as well as for long term reliability. The prior art has attempted to solve this problem by using a InGaP large band gap material as a blocking layer. The additional problem for InGaAsP/InP telecom lasers arises at operation at high current densities. Measurements of output power versus current (P-I characteristics) at both short pulsed regime and continuous wave (CW) regime demonstrate the transition from a linear performance to a sublinear performance at high current density. This phenomenon is called the P-I characteristic rollover or saturation effect. In the short pulse regime, where device heating is negligible, the saturation effect is purely current induced and is associated with an increase of the electron concentration and electrical field at the active region/p-doped cladding layer interface. The result is that the electron current component that is directed from the active region to the p-doped clad layer increases. In the CW regime this current component increases additionally due to heating of the active region caused by the high current. Several publications (See, for example, an article entitled, "Effect of Heterobarrier Leakage on the Performance of High-Power 1.5 µm InGaAsP Multiple-Quantum Well Lasers" published in Journal of Applied Physics on pages 2211–2215 by Shterengas et al.) indicated that the increase of p-doping of the active region/p-doped clad interface allows the decreasing of the electron leakage due to the reduction of the interface electrical field. However, the increase of the hole concentration can lead to the decrease of laser efficiency caused by the additional optical losses associated with the strong photon absorption by free holes. In order to solve this problem, a broad waveguide (BW) design was suggested in U.S. Pat. No. 5,818,860, entitled "High Power Semiconductor Laser Diode," issued Oct. 6, 1998, to Garbuzov, the inventor herein. In the case of BW lasers, 99% of the optical mode is confined in the broadened waveguide with total thickness of about 1 µm. The waveguide material is undoped thus providing minimum optical losses for lasing mode. The broad waveguide design was very useful for the fabrication of high power, high efficient diode lasers for numerous but non-telecom applications. The drawback of broad waveguide lasers for telecom applications is the large beam divergence in the direction perpendicular to the laser plane (fast direction). For 1.5 µm lasers with a 1 µm thick waveguide this divergence exceeds 40 degrees at half maximum intensity (FWHM>40°). This value of divergence is not compatible with effective laser coupling in single mode optical fiber. Methods of improving fast axis divergence are well known. For example, one method is to decrease the waveguide thickness down to 10–30 nm. However in the case of such narrow (NW) waveguide structures, a considerable portion (about 40%) of lasing mode propagates in the p-doped clad layer and optical losses caused by free hole absorption is high. As discussed above, the decrease of p-clad doping is not desirable because of electron leakage enhancement.

Thus, there is a need for a new design of telecom MQW low divergence lasers (especially pump lasers for fiber amplifiers) that provide high efficiency device operation at high current densities and elevated temperatures.

SUMMARY OF THE INVENTION

A new design of telecom narrow waveguide low divergence diode light emitting sources, particularly for fiber amplifier pump laser, is disclosed. The design provides high efficiency operation at high current densities and elevated temperatures. To achieve this design, a large band gap blocking layer is incorporated coincident with the p/n junction within the device structure. The large band gap blocking layer material creates an electron energy barrier having a minimum 200 meV greater than adjacent material levels in the conduction band to prevent electron leakage from the active region to a p-doped clad region. In addition, a low doped, region of a wide band gap material is used in combination with the at least one blocking layer to decrease optical losses. In one aspect of the invention, a blocking layer is imposed between the low-doped region and the active region. In a second aspect of the invention the low-doped region is imposed between the blocking layer and the active region.

BRIEF DESCRIPTION OF THE DRAWINGS

In the drawings:

FIG. 2b illustrates a second exemplary semiconductor laser conduction band diagram in accordance with a second aspect of the inventive concept illustrated in FIG. 2a;

FIG. 2c illustrates an exemplary semiconductor laser conduction band diagram in accordance with another aspect of the inventive concept illustrated in FIGS. 2a;

FIG. 3b illustrates a second exemplary semiconductor laser conduction band diagram in accordance with a second aspect of the inventive concept illustrated in FIG. 3a;

FIG. 5 illustrates a comparison of performance results of a conventional 1.48 micron pump laser and 1.48 micron pump laser having a conduction band diagram characteristic as illustrated in FIG. 2a.

Figure 1A:
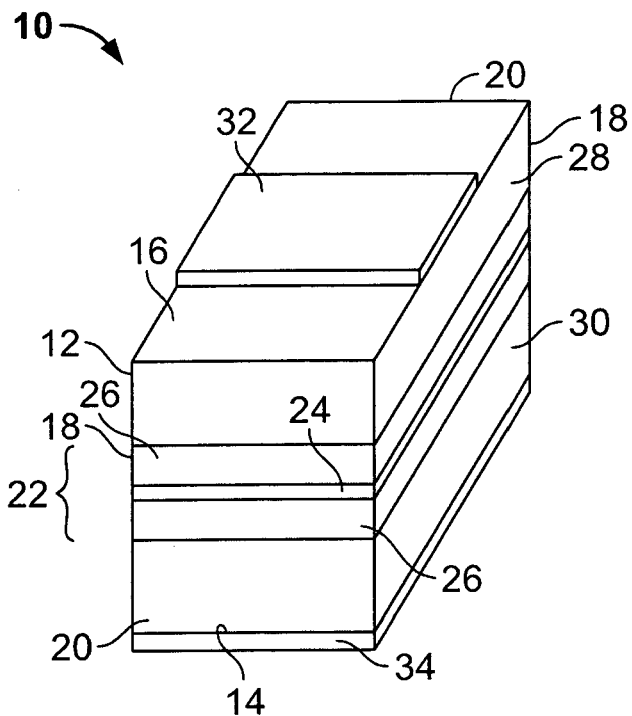
FIG. 1a illustrates a perspective view of a conventional semiconductor laser.

It is to be understood that these drawings are solely for purposes of illustrating the concepts of the invention and are not intended as a level of the limits of the invention. It will be appreciated that the same reference numerals, possibly supplemented with reference characters where appropriate, have been used throughout to identify corresponding parts.

DETAILED DESCRIPTION OF THE INVENTION

Referring to FIG. 1a, which corresponds to FIG. 1 of the referenced U.S. Pat. No., 5,818,860, a semiconductor laser diode is designated as 10. Laser diode 10 comprises a body 12 of a semiconductor material or materials having a bottom surface 14, top surface 16, end surfaces 18 and side surfaces 20. The body 12 includes a waveguide region 22 extending thereacross. Within the waveguide region 22 is an active region 24 in which photons are generated when an appropriate electrical bias is placed across the diode 10. The active region 24 may be of any structure well known in the laser diode art that is capable of generating photons. The active region 24 comprises one or more quantum wells. The waveguide region 22 includes layers 26 on each side of the active region 24, which are of undoped semiconductor material.

On each side of the waveguide region 22 is a separate clad region 28 and 30. The clad regions 28 and 30 are layers of a semiconductor material of a composition, which has a lower refractive index than the materials of the layers 26 of the waveguide region 22. Also, the clad regions 28 and 30 are at least partially doped to be of opposite conductivity type. The doping level in the clad regions 28 and 30 are typically between about $5*10^{17}/cm^3$ and $2*10^{19}/cm^3$. For example, the clad region 28 between the waveguide region 22 and the top surface 16 of the body 12 may be of p-doped conductivity and the clad region 30 between the waveguide region 22 and the bottom surface 14 of the body 12 may be of n-doped conductivity.

A contact layer 32 of a conductive material, such as a metal, is on and in ohmic contact with the p-type conductivity clad region 28. The contact layer 32 is in the form of a strip that extends between the end surfaces 18 of the body 12 and is narrower than the width of the body 12, i.e., the distance between the side surfaces 20 of the body 12. A contact layer 34 of a conductive material, such as a metal, is on and in ohmic contact with the n-type conductivity clad region 30. The contact layer 34 extends across the entire area of the bottom surface 14 of the body 12.

The various regions of the body 12 may be made of any of the well known semiconductor materials used for making laser diode, such as but not limited to gallium arsenide (GaAs), aluminum gallium arsenide (AlGaAs), indium phosphide (InP), indium gallium arsenide (InGaAs) and such quaternary materials as indium gallium arsenide phosphide (InGaAsP). However, the materials used for the various regions must have refractive indices, which provide the desired confinement of the optical mode. The clad regions 28 and 30 may be doped uniformly throughout their thickness or may be graded with little or no doping at their junction with the waveguide region 22 and the heaviest doping at the respective surface of the body 12.

Figure 1B:
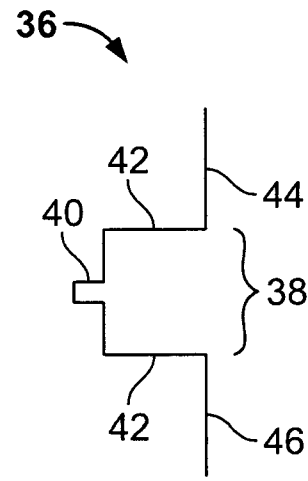
FIG. 1b illustrates a conventional semiconductor laser conduction band diagram.

Referring to FIG. 1b, which corresponds to FIG. 2 of the referenced U.S. Pat. No., 5,818,860, there is schematically shown the conduction band diagram 36 of a laser diode corresponding to the structure of laser diode 10 shown in FIG. 1a. In this schematic representation there is included a waveguide region 38 having therein a single quantum well region 40 of undoped material, e.g., $In_{20}Ga_{80}As$, and a separate confinement layer 42 of undoped material, e.g., $Al_{30}Ga_{70}As$, on each side of the quantum well region 40. A p-doped conductivity clad region 44 is on one side of the waveguide region 38 and an n-doped conductivity clad region 46 is on the other side of the waveguide region 38. Each of the clad regions 44 and 46 are of $Al_{60}Ga_{30}As$. Although the laser diode 36 is shown as having only a single quantum well region 40, it may have a plurality of quantum well regions which are spaced apart by barrier regions as is well known in the laser diode art. Photons are generated as electrons drop into quantum well region 40 and confinement layer 42 inhibits the flow of electrons toward p-doped conductivity clad layer 44 and directs the generated photons travel along a known path.

Figure 2A:
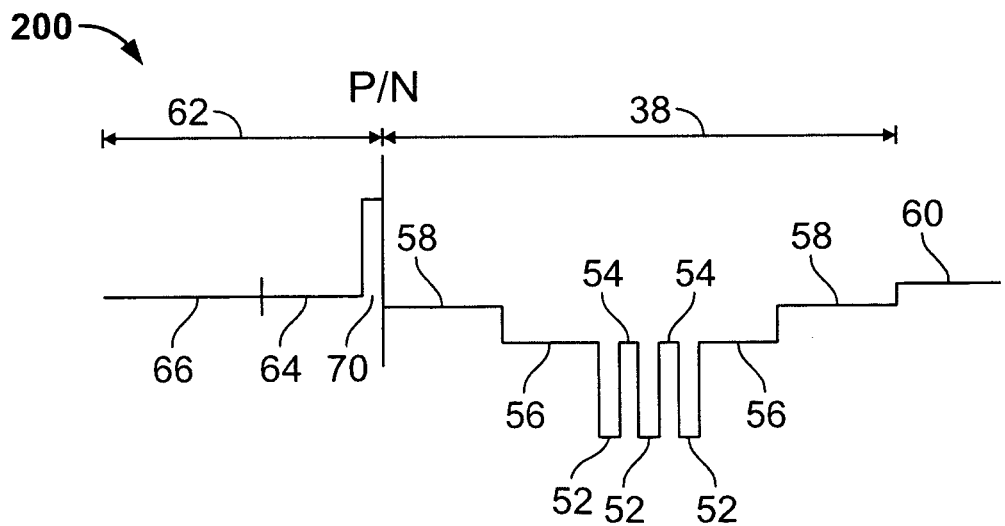
FIG. 2a illustrates an exemplary semiconductor laser conduction band diagram in accordance with one aspect of one embodiment of the invention.

Referring now to FIG. 2a, there is schematically shown a conduction band diagram 200 of one aspect of an optoelectronic device, e.g., a semiconductor laser diode, in accordance with one embodiment of the present invention. In this representation of one embodiment of the invention, the semiconductor waveguide region 38 comprises a plurality of quantum well regions 52 composed of a semiconductor material, such as InGaAsP, which are spaced apart by barrier regions 54. Barrier regions 54 are composed of a semiconductor material, such as InGaAsP having a bandgap energy level represented herein as $Eg^{54}$. At each side of quantum well region 52 is illustrated inner confinement layer 56. Inner confinement layer 56 is composed of a material, such as InGaAsP having a bandgap energy level represented herein as $Eg^{56}$. As would be appreciated, the material of barrier level 54 may be the same or different than that of inner confinement layer 56. Adjacent to each of the inner confinement layers 56 is outer confinement layer 58. Outer confinement layer 58 is composed of a material such as InGaAsP having a bandgap energy level represented herein as $Eg^{58}$. As illustrated, the bandgap energy levels of the confinement regions are formulated such that:

$$Eg^{52} < Eg^{54} <= Eg^{56} < Eg^{58}$$

Adjacent to the outer confinement layers 58 are clad regions 60 and 62 composed of a material, such as InP, that is doped with impurities. Known impurities are added into clad region 60 to achieve an electron concentration, i.e., n-doped, and known impurities are added into clad region 62 to achieve a high hole concentration, i.e., p-doped. Clad regions 60 and 62 are generally doped, as previously discussed, to a level of greater that $5*10^{17}/cm^3$. Furthermore, n-dope type clad region 60 generally is uniformly doped throughout its thickness, but the p-dope type clad region 62 can have a doping level that is graded from a lowest level at the interface with the outer confinement layer 58 to a highest level at its surface. The energy band gap of clad regions 60 and 62 are significantly greater than the energy bandgap of outer confinement region 58.

In accordance with the principle of the invention, a tensile strained blocking layer 70 composed of a large band gap material, such as InGaP, which may also be p-doped, is interposed between outer confinement layer 58 and clad layer 62, i.e., coincident with p/n junction formed between p-type materials and n-type materials. Blocking layer 70 creates an energy barrier that prevents electrons from escaping, i.e., leaking, from the outer confinement region 58 to clad region 62. In this case, bandgap energy level of blocking layer 70, represented as $Eg^{70}$ is such that:

$$Eg^{58} < Eg^{62} < Eg^{70}$$

Blocking layer 70 should create a barrier of not less than 200 meV. The barrier created by blocking layer 70 decreases electron leakage down to one percent of the total drive current. Furthermore, blocking layer 70 is a relatively thin layer, 20–50 nanometers (nm). In a preferred embodiment, blocking layer 70 should not be less than 20 nm to avoid electron tunneling and not greater than 50 nm to decrease series resistance of the device and eliminate the formation of defects when the blocking layer is lattice mismatched with the substrate material.

In another aspect of the invention, clad region 62 is composed of a spacer region 64 and cladding region 66. In this aspect, cladding region 66 is a p-doped layer, as previously described. However, spacer region may be a p-doped InP material or InGaAsP material such that the electron bandgap is represented as:

$$Eg^{66} > Eg^{64} > Eg^{58}$$

In one aspect of the invention, spacer region 64 is a low p-doped in the order of $p=1*10^{17}$ to $2*10^{17}/cm^3$. Furtherstill, the hole concentration in cladding region 66 can be sharply increased up to $10^{18}/cm^3$.

Figure 2B:
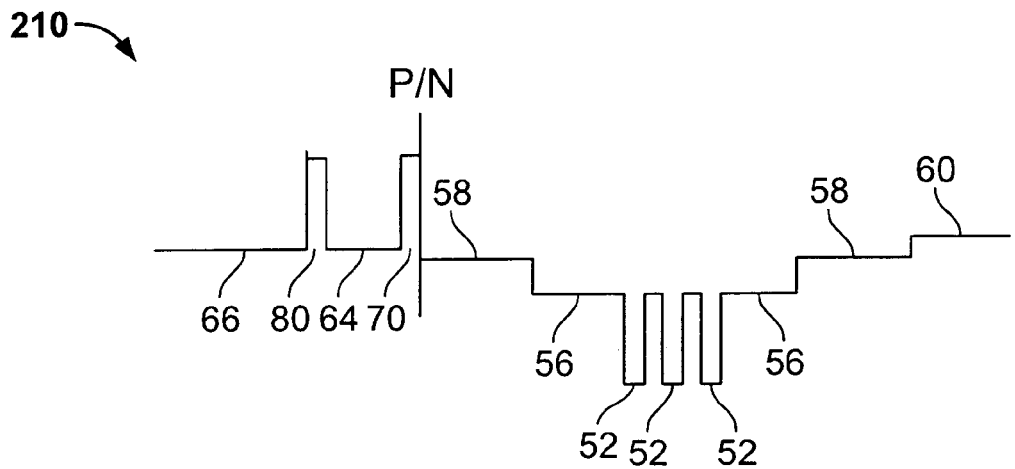

Referring now to FIG. 2b, there is schematically shown a conduction band diagram 210 of a second aspect of a semiconductor laser diode in accordance with the embodiment of the invention illustrated in FIG. 2a. In this aspect of the invention, a second blocking layer 80 composed of a p-doped material, such as InGaP, is introduced at the interface of high-doped cladding region 66 and low-doped spacer layer 64. Second blocking layer 80 preferably is composed of a p-doped material having a doping level providing hole concentration greater than $2*10^{17}/cm^3$. This second blocking layer provides further suppression of the electron leakage current if some portion of the electrons penetrate blocking layer 70.

Figure 2C:
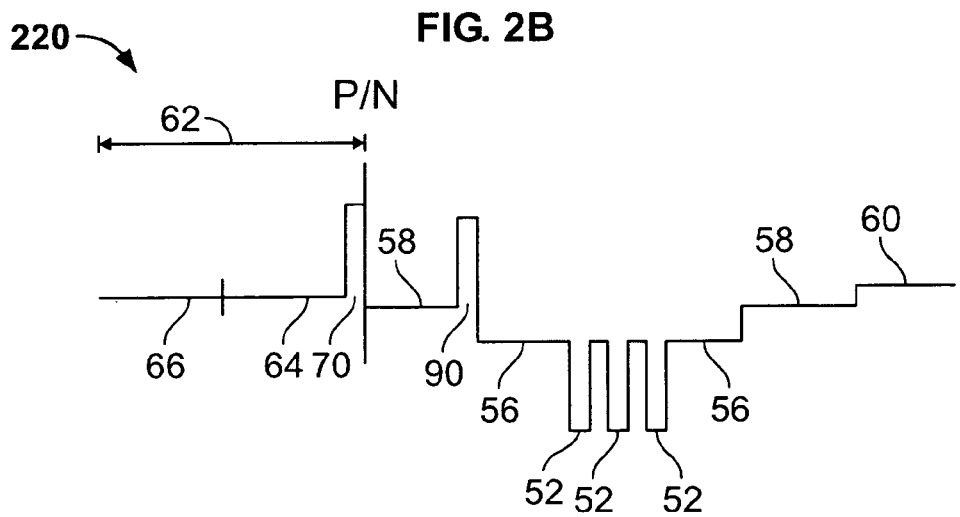

Referring now to FIG. 2c, there is schematically shown a conduction band diagram 220 of another aspect of a semiconductor laser diode in accordance with the embodiment of the invention illustrated in FIG. 2a. In this aspect of the invention, second blocking layer 90 is introduced at the interface of between outer confinement layer 58 and inner confinement layer 56. Preferably, blocking layer 80 is composed of n-doped material of a composition similar to that of blocking layer 70. In this aspect of the invention, the inclusion of second blocking layer 90 prevents electron accumulation in waveguide 38. This accumulation can cause additional optical losses due to free hole absorption in the waveguide layers.

Figure 2D:
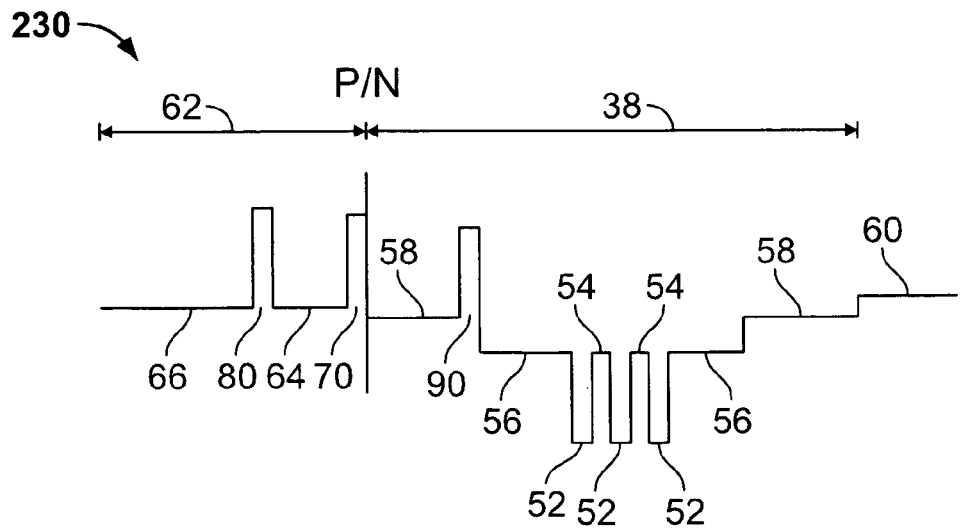
FIG. 2d illustrates an exemplary semiconductor laser conduction band diagram in accordance with an aspect of the inventive concept illustrated in FIGS. 2a, 2b and 2c.

FIG. 2d schematically shows a conduction band diagram 230 of a fourth aspect of the present invention. In this aspect of the present invention, each of the previously described second blocking layers 80 and 90, respectively, are included within a fabricated semiconductor laser.

It should be understood that blocking layers 80 and 90 can be included individually or in combination to achieve a desired limitation of the leakage current outside waveguide region 38. Thus, although the inclusion of illustrated blocking layers to control the leakage current has been progressively shown in FIGS. 2a–2d, it is understood that the incorporation of one blocking layer is independent of other blocking layers. Hence, other combinations of the illustrated blocking layers, although not illustrated, are contemplated as being within the scope of the invention.

Figure 3A:
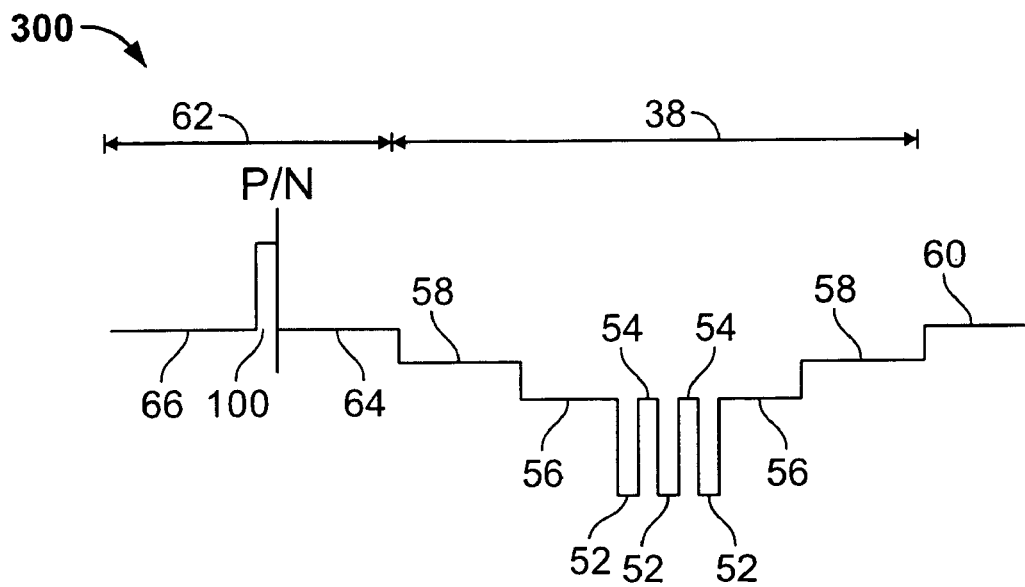
FIG. 3a illustrates an exemplary semiconductor laser conduction band diagram in accordance with one aspect of a second embodiment of the invention.
Figure 3B:
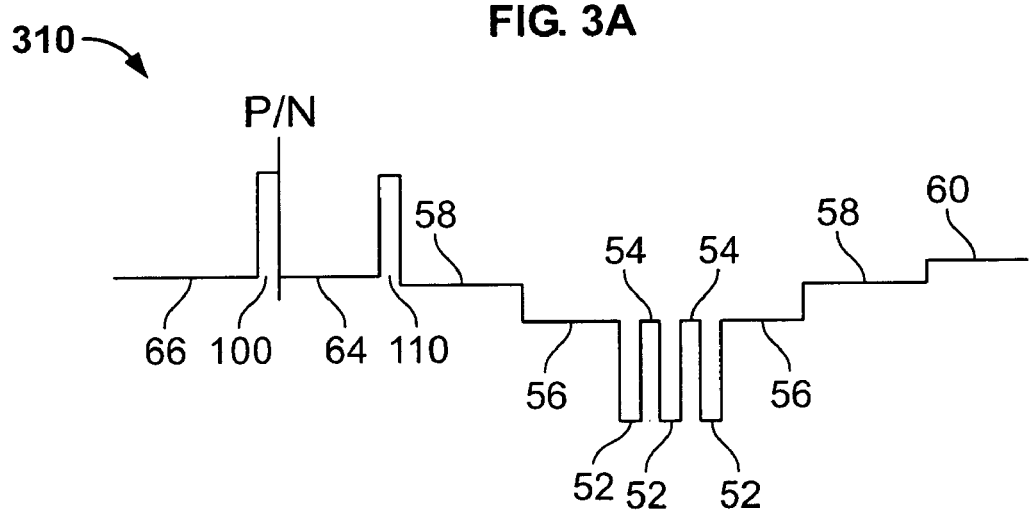
Figure 3C:
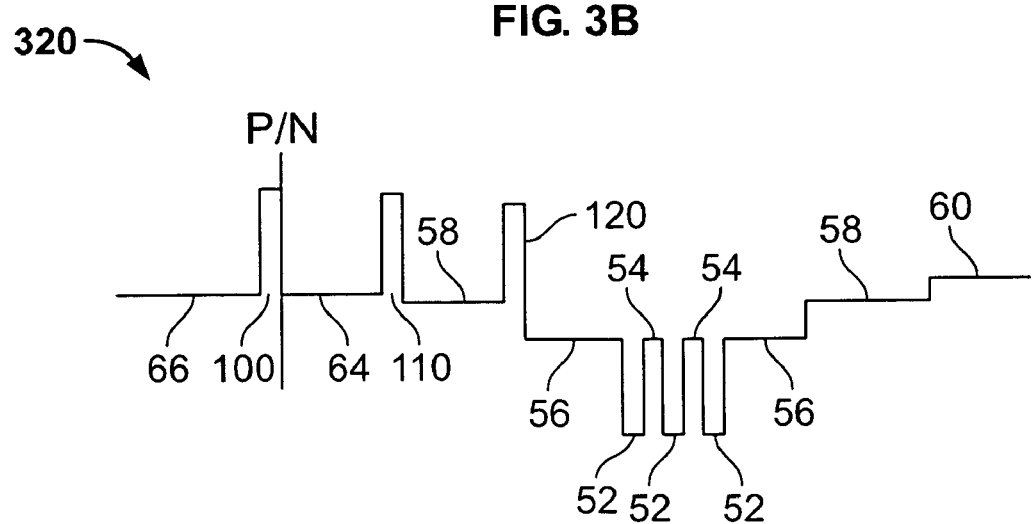
FIG. 3c illustrates an exemplary semiconductor laser conduction band diagram in accordance with a third aspect of the inventive concept illustrated in FIGS. 3a and 3b.

Referring now to FIGS. 3a–3c, there are shown conduction band diagrams corresponding to a second embodiment of the invention. In this illustrative example, blocking layers are progressively included within the semiconductor material in accordance with the principles of the invention. Referring to FIG. 3a, there is illustrates a conduction band diagram 300, depicting a blocking layer 100 of p-doped semiconductor material layer, such as InGaP, formed at the junction of p-doped portion 66 and n-doped portion 64 of clad layer 62. In one aspect of the invention, blocking layer may be tensile strained. The p-doped blocking layer 100, as previously discussed, creates an electron barrier that inhibits the flow of electrons from waveguide region 38 to p-doped portion of cladding region 66. The adjacent low n-doped portion 64 of clad layer 62 has an electron concentration less than $5*10^{17}/cm^3$. At the interface between the low n-doped layer 64 and the p-doped portion 66 of clad layer 62 the hole concentration increases sharply up to $10^{18}/cm^3$. This increase in the p-doping provides a low resistance for the device.

FIG. 3b illustrates a second aspect of the invention, wherein an n-doped, strained, blocking layer 110 of a material, such as InGaP, is formed at the interface of outer confinement layers 58 and low doped spacer region 64. In this aspect of the invention, spacer region 64 is an undoped material, such as InP. This additional blocking layer provides further suppression of a electron leakage current.

FIG. 3c illustrates another aspect of the invention, wherein a second n-doped blocking layer 120 of a material, such as InGaP, is incorporated at the interface between inner confinement layer 56 and outer confinement layer 58. Blocking layer 120 prevents electron accumulation in waveguide 38. Accumulation of electrons in waveguide 38 can create additional optical losses due to free hole absorption in the waveguide layers.

Figures 4A, 4B:
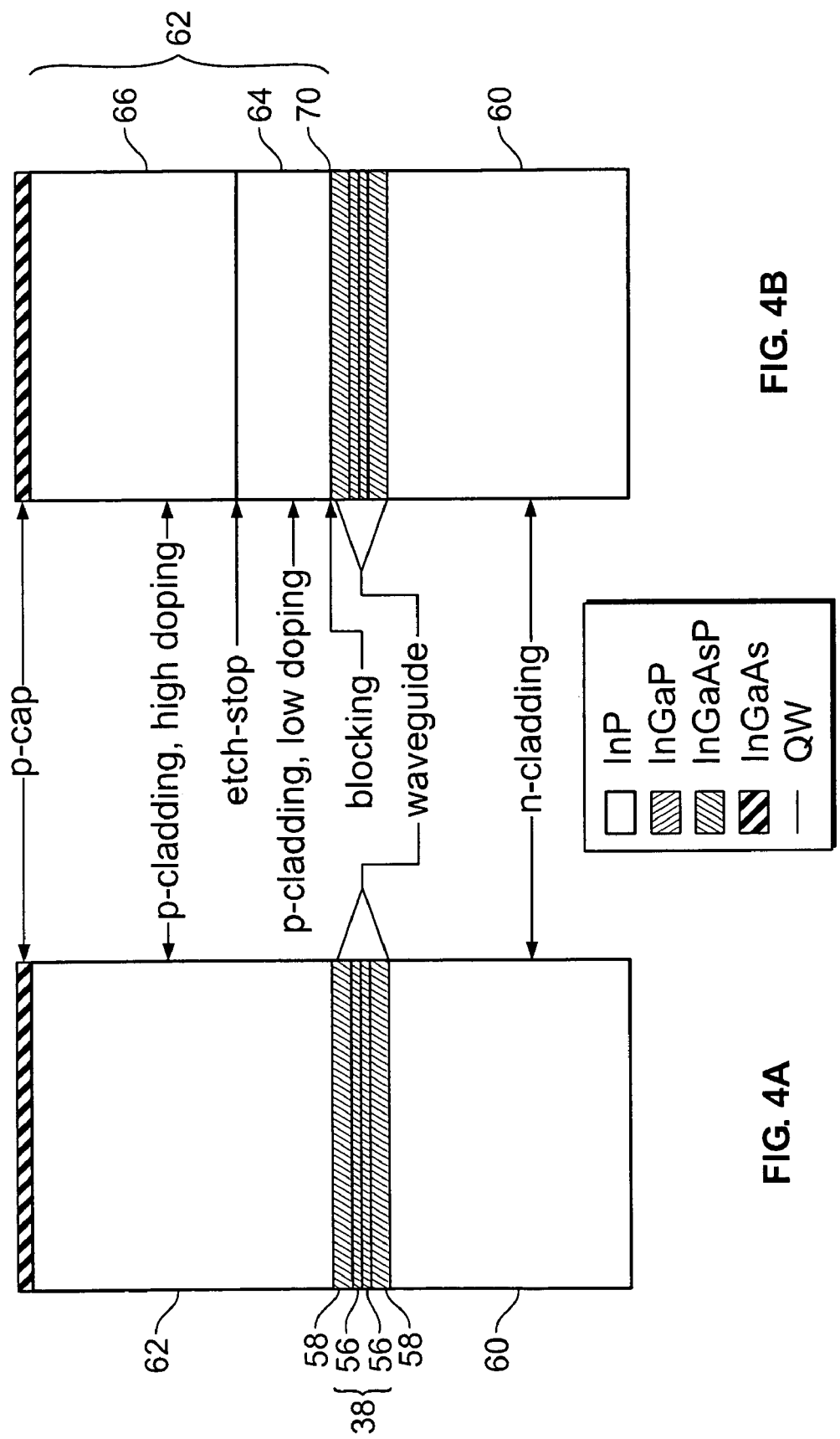
FIG. 4a illustrates an exemplary cross-sectional epistructure of a conventional Quantum Well (QW) semiconductor radiation source device.
FIG. 4b illustrates an exemplary cross-sectional epistructure of a QW semiconductor radiation source device in accordance with the principles of the invention.

FIG. 4a depicts a cross-sectional view of an exemplary conventional diode radiation source. In this view, the material layers that compose the device are shown. Hence, n-doped clad layer 60 is composed of a InP material. Active region 38 composed of outer confinement layer 58, inner confinement layer 56 and quantum well 52 is composed on a InGaAsP material. And p-doped clad layer 62 is composed of an InP material.

FIG. 4b depicts a cross-section view of an exemplary semiconductor light emitting device constructed in accordance with one aspect of the invention. More specifically, FIG. 4b illustrates an opto-electronic device having a conduction band diagram similar to that illustrated FIG. 2a. In this illustrative example, blocking layer 70 in interposed at the interface between waveguide layer 38 and p-doped clad layer 62. As is further illustrated, p-doped clad layer 62 is composed of a high-doped 66 portion and a low-doped portion 64. An etch-stop layer is included in the fabrication process to isolate the high-doped layer 66 from low-doped layer 64. In one aspect of the invention, the thickness of low-doped layer 64 may be selected to as:

$$d \geq \frac{\lambda}{2}\phi$$

where d is said low doped material thickness;
  λ is an operational wavelength; and
  φ is a desired beam divergence expressed in radians.

Figure 5:
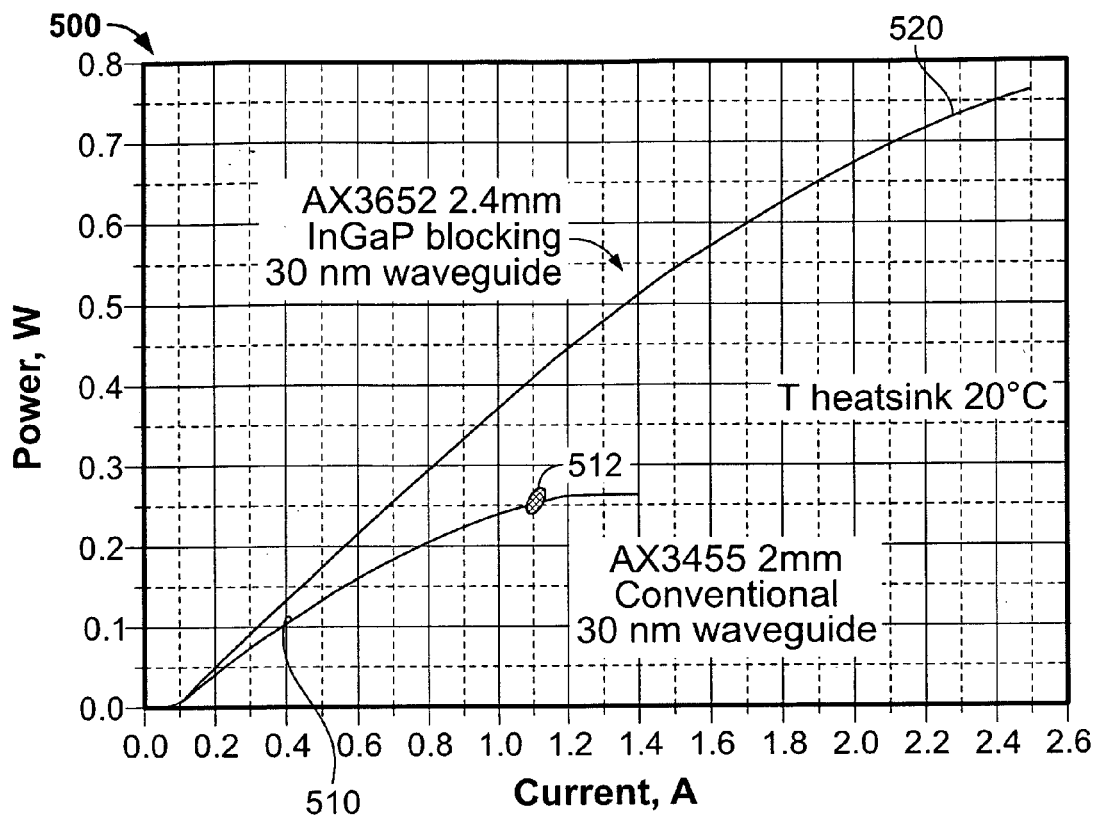

FIG. 5 depicts a graph 500 illustrating the performance of output power with respect to input current for both a conventional semiconductor laser and a semiconductor laser incorporating the features of the present invention. In this example, the semiconductor laser of the present invention is constructed having a conduction band diagram similar to that illustrated in FIG. 2a. As is represented by graph 510, the output power of the conventional laser increases with increased input current up to a known level 512. Thereafter, the output power remains substantially constant for any increase in current. On the other hand, the output power, as represented by graph 520, of the laser device incorporating blocking layer technology of the present invention, increases linearly with increasing input current achieving a power of 750 mW. Hence, the radiation source device in accordance with principles of the invention experiences a substantially linear increase in output power with input current and does not experience a saturation output power with increased input current.

Figure 6:
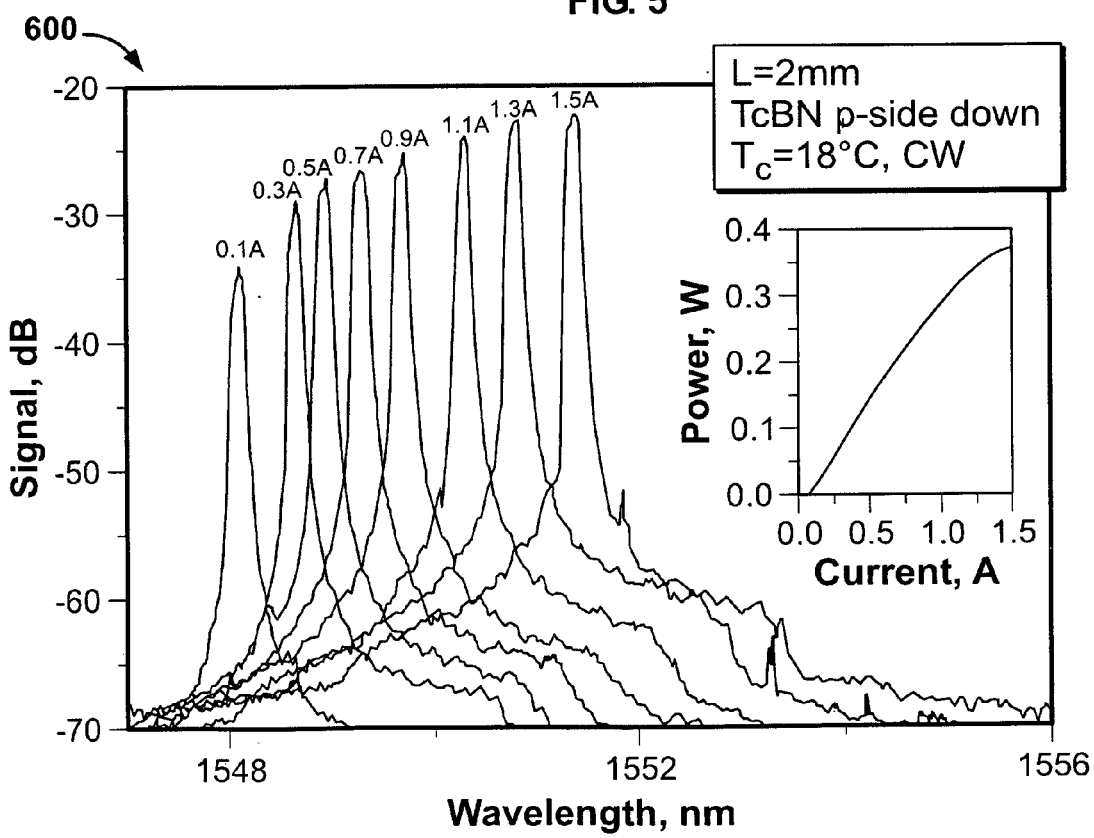
FIG. 6 illustrates P-I characteristics and power output spectra of a DFB laser fabricated in accordance with the principles of the invention.

FIG. 6 graphically illustrates the P-I characteristics, in the insert box, and the output power spectra of a single-mode, single-frequency DFB laser fabricated in accordance with the principles of the present invention. As illustrated, as input current increases, the output power increases, up to 370 mW, while the spectra remains substantially single frequency. Furthermore, the intensity of the side modes remains significantly lower than the main output. This performance is advantageous, particularly in telecommunication systems, as the narrow frequency operation limits interference from one carrier wavelength to another.

Although the invention has been described and discussed with regard to semiconductor lasers as a preferred form with a certain degree of particularity, it is understood that the present disclosure of the preferred form, has been made only by way of example, and that numerous changes in the details may be made without departing from the spirit and scope of the invention as hereinafter claimed. For example, the method of incorporating blocking layers to prevent the leakage of electron current may also be used in other opto-electronic devices, such as gain chips, SLEDs, optical amplifiers, DFB lasers, etc. It is intended that the patent shall cover by suitable expression in the appended claims, those features of patentable novelty that exists in the invention disclosed.

What is claimed is:

1. A semi-conductor opto-electronic device comprising:
   a plurality of semiconductor materials adjacently connected and having different compositions, including p-type composition materials and n-type composition materials, wherein a p/n junction is formed between p-type composition materials;
   an active layer formed in at least one of the n-type composition materials;
   a blocking layer adjacent to said p/n junction, wherein said blocking layer is formed from a material of such a composition to produce a barrier in a conduction band to inhibit electrons from traversing from the active region to a p-type materials; and a low-doped material layer adjacent to said blocking layer having a doping level lower than a doping level of a layer adjacent to the low-doped material.

2. The device as recited in claim 1 further comprising:

at least one second blocking layer at at least one interface between adjacently connected materials, wherein said second blocking layer is of such a composition as to produce at least one second barrier in said conduction band to inhibit electrons from traversing said at least one interface.

3. The device as recited in claim 2 wherein said at least one second blocking layer is formed from a material selected from the group consisting of InGaP, InAlAs, InAlGaAs, GaP, and AlAs.

4. The device as recited in claim 2 wherein said at least one second blocking layer is adapted to provide a barrier with an electron energy of at least 200 meV greater than a conduction band level of a material adjacent to the blocking layer.

5. The device as recited in claim 2 wherein each of said at least one second blocking layer has a thickness of 20–50 nanometers.

6. The device as recited in claim 1 wherein said plurality of materials is selected from the group consisting of InGaAsP/InP, InAlGaAs/Inp, AlGaAs/GsAs, AlInGaAsSb/GaAs, and InGaAlPAs/GaAs.

7. The device as recited in claim 1 wherein said blocking layer is formed from a material selected from the group consisting of InGaP, InAlAs, InAlGaAs, GaP, and AlAs. and AlAs.

8. The device as recited in claim 1 wherein said blocking layer is adapted to provide a barrier with an electron energy at least 200 meV greater than a conduction band level of a material adjacent to the blocking layer.

9. The device as recited in claim 1 wherein said blocking layer is interposed between said low-doped material and said active region.

10. The device as recited in claim 1 wherein said low-doped material is interposed between said blocking layer and said active layer.

11. The device recited in claim 1 wherein said blocking layer is p-doped.

12. The device as recited in claim 1 wherein said blocking layer has a thickness of 20–50 nanometers.

13. The method as recited in claim 1 wherein said low-doped material layer has a thickness that is determined as:

$$d \geq \frac{\lambda}{2}\phi,$$

where d is the thickness of low-doped material layer;
λ is an operational wavelength of the source device; and
φ is a desired beam divergence of a beam emitted from the source device, expressed in radians.

14. A high power semiconductor device opto-electronic source device comprising:

a waveguide region, said waveguide region including an active region containing at least one quantum well for the generation of photons therein;

a clad region, said clad region having a lower refractive index than said waveguide region and a p/n junction formed between the clad region and the waveguide region;

a blocking layer adjacent to said p/n junction and having a large band gap creating a barrier to prevent electron leakage from said active region to said clad region; and a low-doped material layer adjacent to said blocking layer.

15. The device as recited in claim 14 wherein said blocking layer has a thickness of 20–50 nanometers.

16. The device as recited in claim 14 wherein said blocking layer is adapted to provide a barrier with an electron energy of at least 200 meV greater than a conduction band level of an adjacent material.

17. The device as recited in claim 14 wherein said waveguide region further comprises at least one containment layer.

18. The device as recited in claim 17, wherein the waveguide region comprises at least two containment layers, and further comprising a second blocking layer interposed between said at least two containment layers.

19. The device as recited in claim 18 wherein said second blocking layer is adapted to provide a barrier with an electron energy of at least 200 meV greater than a conduction band of an adjacent layer.

20. The device as recited in claim 14 wherein said low-doped layer is interposed between said clad region and said blocking layer.

21. The device as recited in claim 14 wherein said low-doped layer is interposed between said blocking layer and said active region.

22. The device as recited in claim 14 wherein said p/n junction is formed at the interface between said clad region and said waveguide region.

23. The device as recited in claim 14 wherein said low-doped material layer has a thickness that is determined as:

$$d \geq \frac{\lambda}{2}\phi,$$

where d is the thickness of said low-doped material layer;
λ is an operational wavelength of the source device; and
φ is a desired beam divergence of a beam emitted from the source device, expressed in radians.

* * * * *

UNITED STATES PATENT AND TRADEMARK OFFICE
CERTIFICATE OF CORRECTION

PATENT NO.       : 7,084,444 B2
APPLICATION NO.  : 10/471794
DATED            : August 1, 2006
INVENTOR(S)      : Dmitri Zalmanovich Garbuzov and Raymond J. Menna It is certified that error appears in the above-identified patent and that said Letters Patent is hereby corrected as shown below:

Col. 8, lines 56- 67, Col. 9 lines 1-5
Claim 1 should read as follows:

1. A semi-conductor opto-electronic device comprising:
 a pluraltiy of seminconductor materials adjacently connected and having different compositions, including p-type composition materials and n-type composition materials, wherein a p/n junction is formed between p-type composition materials <u>and n-type composition materials;</u>
 an active layer formed in at least one of the n-type composition materials;
 a blocking layer adjacent to said p/n junction, wherein said blocking layer is formed from a material of such a composition to produce a barrier in a conduction band to inhibit electrons from traversing from the active region to a p-type materials; and
 a low-doped material layer adjacent to said blocking layer and having a doping level lower than a doping level of a layer adjacent to the low-dope material.

Signed and Sealed this

Eleventh Day of December, 2007

JON W. DUDAS
*Director of the United States Patent and Trademark Office*